US010581439B1

(12) United States Patent
Pavlovic et al.

(10) Patent No.: US 10,581,439 B1
(45) Date of Patent: Mar. 3, 2020

(54) CLOCK SYNCHRONIZATION IN AN ADPLL

(71) Applicant: NXP B.V., Eindhoven (NL)

(72) Inventors: Nenad Pavlovic, Eindhoven (NL); Vladislav Dyachenko, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/457,845

(22) Filed: Jun. 28, 2019

(51) Int. Cl.
| G06F 1/10 | (2006.01) |
| H03L 7/089 | (2006.01) |
| H03L 7/087 | (2006.01) |
| H03M 1/46 | (2006.01) |
| G04F 10/00 | (2006.01) |
| H03L 7/099 | (2006.01) |

(52) U.S. Cl.
CPC .......... *H03L 7/0895* (2013.01); *G04F 10/005* (2013.01); *H03L 7/087* (2013.01); *H03L 7/0992* (2013.01); *H03M 1/466* (2013.01); *G06F 1/10* (2013.01); *H03L 2207/50* (2013.01)

(58) Field of Classification Search
USPC .................................. 375/355; 327/158, 157
See application file for complete search history.

(56) References Cited

U.S. PATENT DOCUMENTS

| 7,164,742 | B2 * | 1/2007 | McLeod | G06F 1/10 375/355 |
| 2008/0136535 | A1 * | 6/2008 | Khorram | H03L 7/0891 331/17 |
| 2013/0093483 | A1 * | 4/2013 | Lamanna | H03L 7/087 327/157 |
| 2016/0112055 | A1 * | 4/2016 | Mirajkar | H03L 7/095 327/158 |
| 2016/0241301 | A1 | 8/2016 | Pavlovic et al. | |

OTHER PUBLICATIONS

Hsu, C.M. et al. "A Low-Noise Wide-BW 3.6-GHz Digital SD Fractional-N Frequency Synthesizer With a Noise-Shaping Time-to-Digital Converter and Quantization Noise Cancellation," IEEE Journal of Solid-State Circuits, vol. 43, No. 12, pp. 2776-2786, Dec. 2008.

Ginosar, R. "Fourteen Ways to Fool your Synchronizer", Proceedings of the Ninth International Symposium on Asynchronous Circuits and Systems (ASYNC'03), 8 pgs., 2003.

(Continued)

*Primary Examiner* — Eva Y Puente (57) ABSTRACT

Embodiments of a clock synchronization unit of an All Digital Phase-Locked Loop (ADPLL), a successive approximation register (SAR) Time-to-Digital Converter (TDC) of an ADPLL and a method for clock synchronization in an ADPLL are disclosed. In one embodiment, a clock synchronization unit of an ADPLL includes a two-flop synchronizer, a phase frequency detector (PFD) connected to the two-flop synchronizer, and a synchronization control circuit configured to control the two-flop synchronizer and the PFD to perform clock synchronization between a reference clock input signal and a divided clock input signal and to control the two-flop synchronizer and the PFD to replace a performance of the clock synchronization between the reference clock input signal and the divided clock input signal with a PFD operation. Other embodiments are also described.

20 Claims, 5 Drawing Sheets

(56) References Cited

OTHER PUBLICATIONS

Yao, C. W. et al. "A 14nm fractional-N digital PLL with 0.14psrms jitter and -78dBc fractional spur for cellular RFICs," in 2017 IEEE International Solid-State Circuits Conference (ISSCC), pp. 422-423, 2017.

Ginsburg, B. P. et al. "An energy-efficient charge recycling approach for a SAR converter with capacitive DAC," in 2005 IEEE International Symposium on Circuits and Systems, p. 184-187 vol. 1., 2005.

* cited by examiner

CLOCK SYNCHRONIZATION IN AN ADPLL

BACKGROUND

An All Digital Phase-Locked Loop (ADPLL) can be used to generate clocks in digital and analog circuits. In a frequency divider based ADPLL, a reference clock and a divider clock are mutually asynchronous during a phase locking stage and the phase relation between the reference clock and the divider clock is known during a phase tracking stage when phase lock is achieved. In a frequency divider based ADPLL, clock synchronization between a reference clock and a divider clock may introduce metastability and/or increase noise. For example, a one-flop synchronizer may enter metastability during a phase tracking stage because the reference clock can change simultaneously with a sampling edge of the divider clock.

SUMMARY

Embodiments of a clock synchronization unit of an ADPLL, a successive approximation register (SAR) Time-to-Digital Converter (TDC) of an ADPLL and a method for clock synchronization in an ADPLL are disclosed. In one embodiment, a clock synchronization unit of an ADPLL includes a two-flop synchronizer, a phase frequency detector (PFD) connected to the two-flop synchronizer, and a synchronization control circuit configured to control the two-flop synchronizer and the PFD to perform clock synchronization between a reference clock input signal and a divided clock input signal and to control the two-flop synchronizer and the PFD to replace a performance of the clock synchronization between the reference clock input signal and the divided clock input signal with a PFD operation. Other embodiments are also described.

In one embodiment, the PFD operation includes generating charge pump control signals at the PFD for a charge pump unit of the ADPLL.

In one embodiment, the synchronization control circuit is further configured to generate a synchronization control signal in response to the divided clock input signal. The two-flop synchronizer includes serially connected first and second flip-flops configured to be enabled by the divided clock input signal and first and second multiplexers connected to the first and second flip-flops and configured to select one of multiple inputs as an output in response to the synchronization control signal.

In one embodiment, the synchronization control circuit is further configured to generate a PFD control signal in response to the divided clock input signal. The PFD includes a first flip-flop configured to be enabled by the reference clock input signal to generate a first charge pump control signal, a second flip-flop configured to be enabled in response to the PFD control signal to generate a second charge pump control signal, and a multiplexer configured to generate a reset signal for the first and second flip-flops in response to the first and second charge pump control signals.

In one embodiment, the PFD further includes an AND gate configured to generate an input for the multiplexer based on the first and second charge pump control signals.

In one embodiment, the clock synchronization unit is a component of an SAR TDC of the ADPLL. The synchronization control circuit is further configured to generate a PFD control signal in response to the divided clock input signal. The PFD includes a first flip-flop configured to be enabled by the reference clock input signal to generate a first charge pump control signal for a charge pump unit of the SAR TDC, a second flip-flop configured to be enabled in response to the PFD control signal to generate a second charge pump control signal for the charge pump unit of the SAR TDC, a multiplexer configured to generate a reset signal for the first and second flip-flops in response to the first and second charge pump control signals, and an AND gate configured to generate an input for the multiplexer based on the first and second charge pump control signals.

In one embodiment, the synchronization control circuit includes flip-flops connected to the PFD or to the two-flop synchronizer.

In one embodiment, the flip-flops include serially connected first and second flip-flops configured to be enabled by an inverted version of the divided clock input signal, serially connected third and fourth flip-flops configured to be reset by an output of the first and second flip-flops, and a fifth flip-flop configured to be enabled by an inverted version of the divided clock input signal and to be reset by the output of the first and second flip-flops.

In one embodiment, the synchronization control circuit further includes a first AND gate configured to perform an AND operation on a synchronization control signal and a counter value and a second AND gate configured to perform an AND operation on the divided clock input signal and an output of the fifth flip-flop.

In one embodiment, an SAR TDC for an ADPLL includes a clock synchronization unit, a charge pump unit connected to the clock synchronization unit, an integrator unit connected to the charge pump unit, and a successive approximation ADC unit. The clock synchronization unit includes a two-flop synchronizer, a phase frequency detector (PFD) connected to the two-flop synchronizer, and a synchronization control circuit configured to control the two-flop synchronizer and the PFD to perform clock synchronization between a reference clock input signal and a divided clock input signal and to control the two-flop synchronizer and the PFD to replace a performance of the clock synchronization between the reference clock input signal and the divided clock input signal with a PFD operation. The charge pump unit is configured to generate a current pulse based on a time difference between the reference clock input signal and the divided clock input signal. The integrator unit is configured to generate an integrator output voltage based on the current pulse. The successive approximation ADC unit is configured to generate a digital signal based on the integrator output voltage by successive approximation.

In one embodiment, the PFD operation includes generating charge pump control signals at the PFD for the charge pump unit.

In one embodiment, the synchronization control circuit is further configured to generate a synchronization control signal in response to the divided clock input signal. The two-flop synchronizer includes serially connected first and second flip-flops configured to be enabled by the divided clock input signal and first and second multiplexers connected to the first and second flip-flops and configured to select one of multiple inputs as an output in response to the synchronization control signal.

In one embodiment, the synchronization control circuit is further configured to generate a PFD control signal in response to the divided clock input signal. The PFD includes a first flip-flop configured to be enabled by the reference clock input signal to generate a first charge pump control signal for the charge pump unit, a second flip-flop configured to be enabled in response to the PFD control signal to generate a second charge pump control signal for the charge pump unit, and a multiplexer configured to generate a reset signal for the first and second flip-flops in response to the first and second charge pump control signals.

In one embodiment, the PFD further includes an AND gate configured to generate an input for the multiplexer based on the first and second charge pump control signals.

In one embodiment, the synchronization control circuit includes flip-flops connected to the PFD or to the two-flop synchronizer.

In one embodiment, the flip-flops include serially connected first and second flip-flops configured to be enabled by an inverted version of the divided clock input signal, serially connected third and fourth flip-flops configured to be reset by an output of the first and second flip-flops, and a fifth flip-flop configured to be enabled by an inverted version of the divided clock input signal and to be reset by the output of the first and second flip-flops.

In one embodiment, the synchronization control circuit further includes a first AND gate configured to perform an AND operation on a synchronization control signal and a counter value and a second AND gate configured to perform an AND operation on the divided clock input signal and an output of the fifth flip-flop.

In one embodiment, a method for clock synchronization in an ADPLL involves controlling a two-flop synchronizer and a PFD connected to the two-flop synchronizer to perform clock synchronization between a reference clock input signal and a divided clock input signal and controlling the two-flop synchronizer and the PFD to replace a performance of the clock synchronization between the reference clock input signal and the divided clock input signal with a PFD operation.

In one embodiment, controlling the two-flop synchronizer and the PFD to replace the performance of the clock synchronization between the reference clock input signal and the divided clock input signal with the PFD operation the PFD operation includes controlling the two-flop synchronizer and the PFD to replace the performance of the clock synchronization between the reference clock input signal and the divided clock input signal with generating charge pump control signals at the PFD for a charge pump unit of the ADPLL.

In one embodiment, generating the charge pump control signals at the PFD for the charge pump unit of the ADPLL comprises generating the charge pump control signals at the PFD for adjusting current sources of the charge pump unit of the ADPLL.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
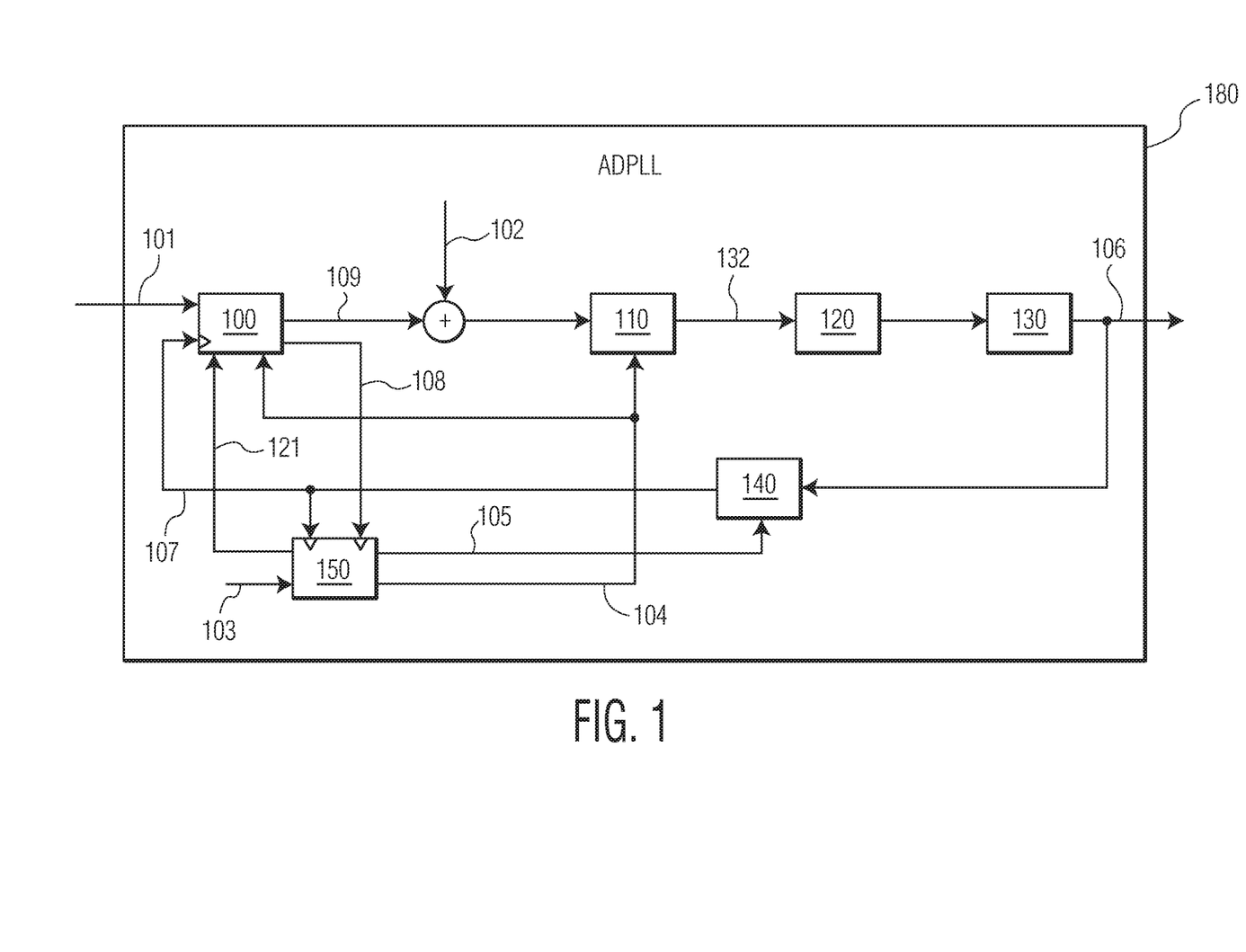
FIG. 1 is a schematic block diagram of an ADPLL in accordance with an embodiment of the invention.

FIG. 1 is a schematic block diagram of an ADPLL 180 in accordance with an embodiment of the invention. In the embodiment depicted in FIG. 1, the ADPLL includes a successive approximation register (SAR) Time-to-Digital Converter (TDC) 100, a quantization noise cancelling unit 110, a digital loop filter 120, a digitally controlled oscillator (DCO) 130, a frequency divider 140, and a digital control unit 150. In some embodiments, the ADPLL is used to compare the phase of a reference signal with the phase of a signal that is derived from the output signal of the ADPLL and to adjust the DCO to keep the phases of the two signals matched. The ADPLL can be used for communications, computers, and other electronic applications. Although the illustrated ADPLL is shown with certain components and described with certain functionality herein, other embodiments of the ADPLL may include fewer or more components to implement the same, less, or more functionality.

In the embodiment depicted in FIG. 1, a divided clock input signal 107 from the frequency divider 140 and a reference clock input signal 101 are received by the SAR TDC 100. The SAR TDC is configured to determine the time difference between the reference clock input signal and the divided clock input signal. In some embodiments, the SAR TDC generates a sampled reference clock signal 108 and/or a normalized SAR TDC output 109 based on the time difference between the reference clock input signal and the divided clock input signal.

In the embodiment depicted in FIG. 1, the quantization noise cancelling unit 110 is configured to reduce or cancel divider quantization noise. The output of the quantization noise cancelling unit is a phase error signal 132, which is provided to the digital loop filter 120. In some embodiments, the result of adding a phase offset signal 102 to the normalized SAR TDC output 109 from the SAR TDC 100 is provided to the quantization noise cancelling unit to reduce or cancel divider quantization noise in the digital domain.

In the embodiment depicted in FIG. 1, the digital loop filter 120 is configured to convert the phase error signal 132 into a digital output to control the DCO 130. The DCO 130 is configured to generate an output signal 106, which is the output of the ADPLL.

In the embodiment depicted in FIG. 1, the frequency divider 140 is configured to receive the output signal 106 of the DCO 130 and to divide the frequency of the output signal 106 to generate the divided clock input signal 107, whose frequency is a fraction of the frequency of the output signal 106.

In the embodiment depicted in FIG. 1, the digital control unit 150 is configured to control the SAR TDC 100, the quantization noise cancelling unit 110, and/or the frequency divider 140. The digital control unit may be implemented as a digital signal processor (DSP), a microcontroller or a central processing unit (CPU). In some embodiments, the digital control unit includes a sigma-delta modulator. In the embodiment depicted in FIG. 1, the digital control unit provides a synchronization control signal 121 to the SAR TDC, a divider value 105 to the frequency divider and an accumulated sigma-delta error 104 to the quantization noise cancelling unit 110, based on a normalized tuning word (NTW) 103. In some embodiments, the digital control unit receives the sampled reference clock signal 108 from the SAR TDC and the divided clock input signal 107 from the frequency divider 140.

Figure 2:
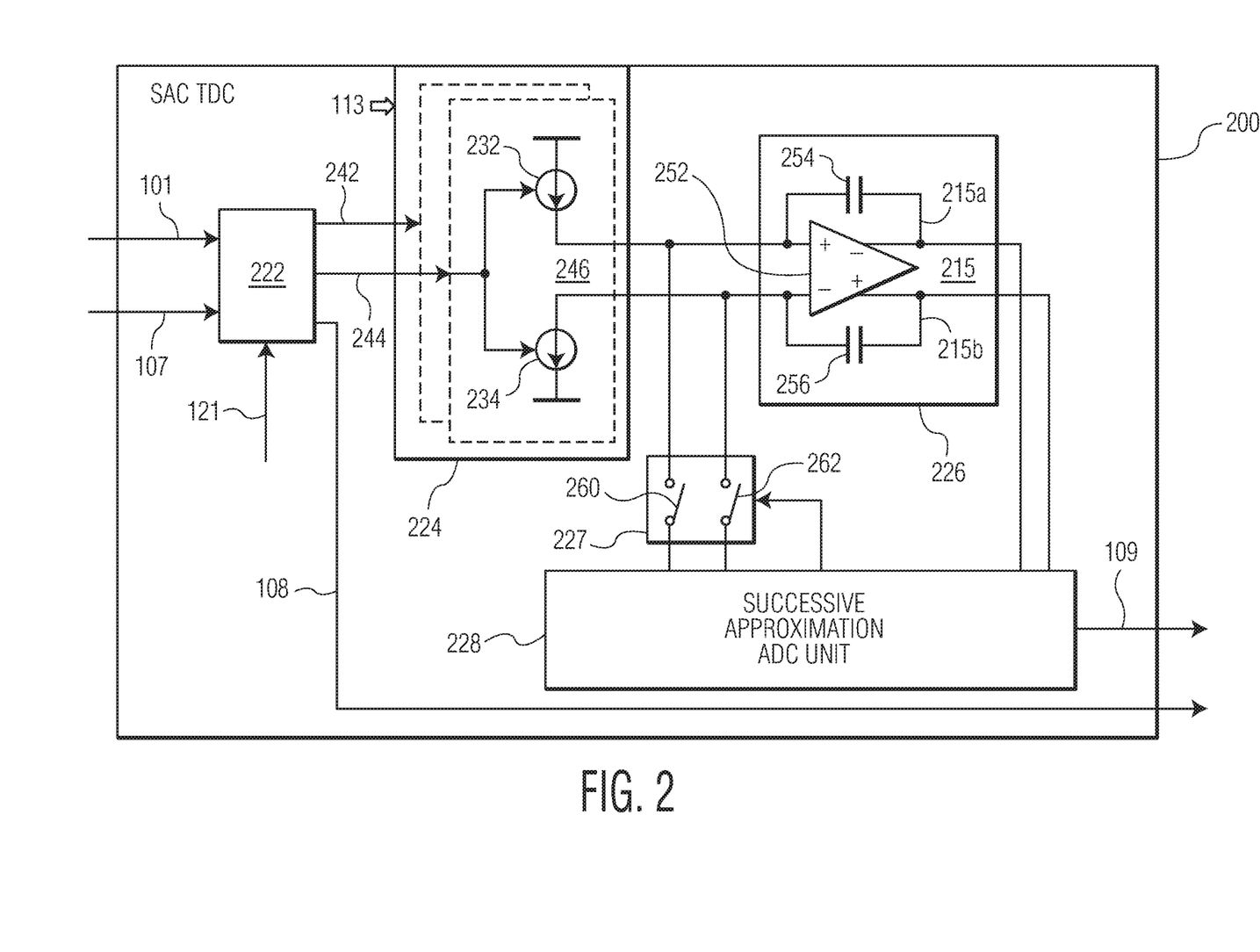
FIG. 2 depicts an SAR TDC of the ADPLL depicted in FIG. 1 in accordance with an embodiment of the invention.

FIG. 2 depicts an SAR TDC 200 in accordance with an embodiment of the invention. The SAR TDC 200 depicted in FIG. 2 is an embodiment of the SAR TDC 100 depicted in FIG. 1. However, the SAR TDC 100 depicted in FIG. 1 is not limited to the embodiment shown in FIG. 2. In the embodiment depicted in FIG. 2, the SAR TDC 200 includes a synchronization unit 222, a charge pump (CP) unit 224, an integrator unit 226, a switching unit 227, and a successive approximation analog-to-digital converter (ADC) unit 228.

In the embodiment depicted in FIG. 2, the synchronization unit 222 is provided with the reference clock input signal 101 and the divided clock input signal 107 from the frequency divider 140 of the ADPLL 180 depicted in FIG. 1. In some embodiments, the synchronization unit converts the time difference between cycles of the reference clock input signal and the divided clock input signal into output signals 242, 244, whose durations are based on the time difference between respective cycles of the reference clock input signal and the divided clock input signal.

In the embodiment depicted in FIG. 2, the charge pump unit 224 is connected to the clock synchronization unit 222 and includes "up" current sources 232, 234 driven by the signal 244, and at least two "down" current sources (not shown) driven by the signal 242. The charge pump unit is configured to generate a current pulse based on a time difference between the reference clock input signal 101 and the divided clock input signal 107. In the embodiment depicted in FIG. 2, the charge pump unit converts the signals 242, 244 into an output current pulse 246 in response to an input charge pump control signal 113.

In the embodiment depicted in FIG. 2, the integrator unit 226 is connected to the charge pump unit 224 and is configured to generate an integrator output voltage based on the output current pulse 246. The integrator unit may include a transconductance amplifier 252 with feedback capacitance that is represented by capacitors 254, 256. In the embodiment depicted in FIG. 2, the output current pulse 246 from the charge pump unit is connected to non-inverting and inverting inputs, respectively, of the transconductance amplifier, which integrates the charge on the capacitors 254, 256. The transconductance amplifier includes an inverting output 215a and a non-inverting output 215b and the difference between the inverting and non-inverting outputs is the integrator output voltage 215. The integrator output voltage from the transconductance amplifier depends on the integral of the output current pulse from the charge pump unit. The output from the integrator unit is provided to the successive approximation ADC unit 228, which is configured to convert the integrated charge on the capacitors 254, 256 into the normalized SAR TDC output 109 by successive approximation. The successive approximation ADC unit may be implemented with one or more logic circuits. In some embodiments, the successive approximation ADC unit includes at least one comparator, at least one AND gate, at least one control logic, at least one flip-flop, at least one Exclusive OR (XOR) gate, at least one digital-to-analog converter (DAC), and/or at least one shift register. The switch unit 227 is configured to connect the successive approximation ADC unit with the inputs of the transconductance amplifier 252 or to disconnect the successive approximation ADC unit from the inputs of the transconductance amplifier. In some embodiments, the switch unit includes at least two switches 260, 262.

Figure 3:
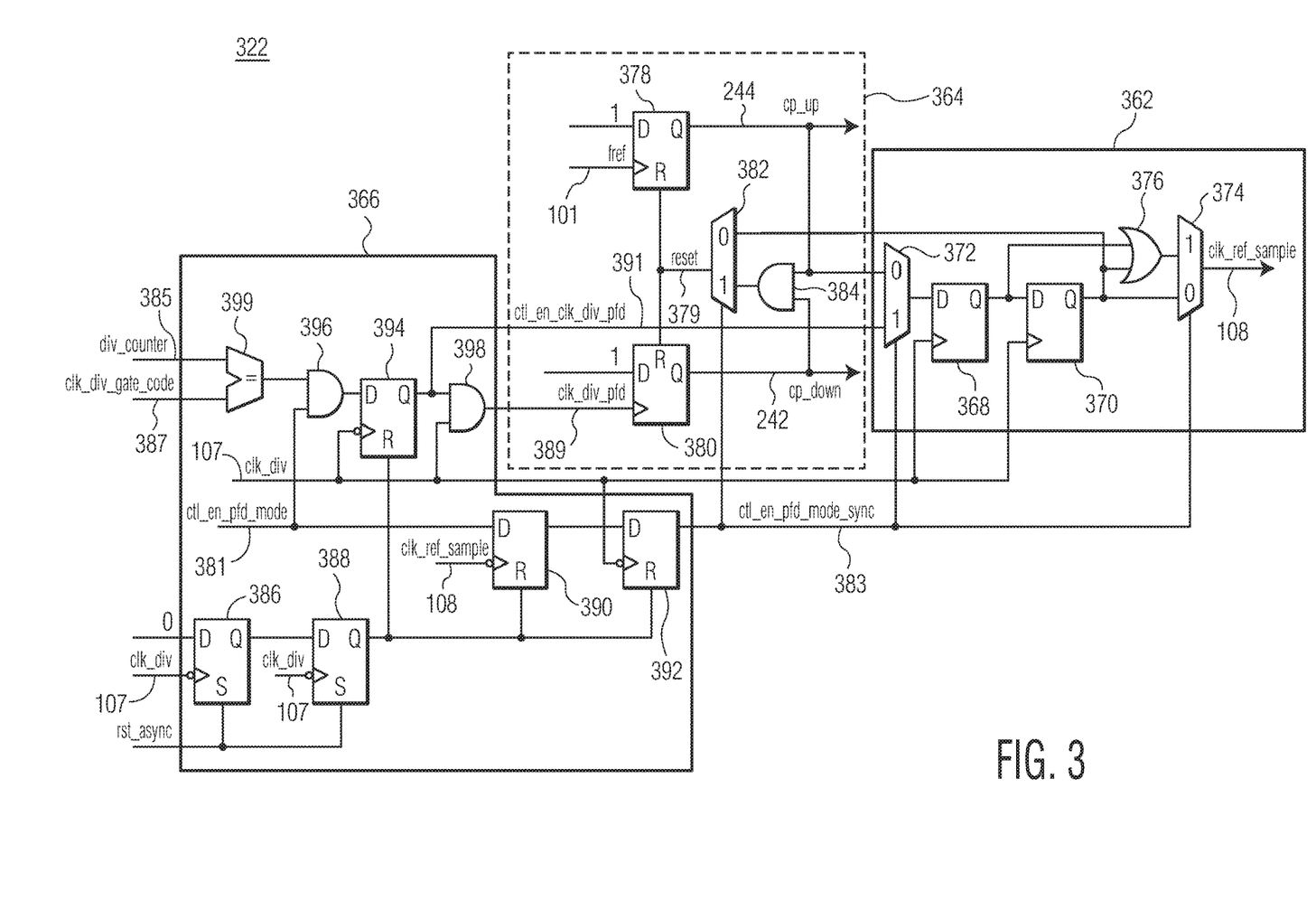
FIG. 3 depicts a synchronization unit of the SAR TDC depicted in FIG. 2 in accordance with an embodiment of the invention.

FIG. 3 depicts a synchronization unit 322 in accordance with an embodiment of the invention. The synchronization unit 322 depicted in FIG. 3 is an embodiment of the synchronization unit 222 depicted in FIG. 2. However, the synchronization unit 222 depicted in FIG. 2 is not limited to the embodiment shown in FIG. 3. In the embodiment depicted in FIG. 3, the synchronization unit 322 includes a two-flop synchronizer 362, a phase frequency detector (PFD) 364, and a synchronization control circuit 366.

In the embodiment depicted in FIG. 3, the synchronization unit 322 operates in a phase locking state and in a phase tracking state, which is selected/controlled by the synchronization control circuit 366. During the phase locking state, the divided clock input signal (clk_div) 107 is used for the synchronization of the reference clock input signal (fref) 101. During the phase tracking state, the synchronization between the reference clock input signal (fret) 101 and the divided clock input signal (clk_div) 107 is replaced by PFD operation under the control of the synchronization control circuit. In some embodiments, a PFD operation involves generating charge pump control signals at the PFD 364 for the charge pump unit 224 of the SAR TDC 200. In an embodiment, a PFD operation involves generating the charge pump control signals 242, 244 at the PFD to control and/or adjust current sources of the charge pump unit. For example, a PFD operation may involve generating the charge pump control signals 242, 244 at the PFD to control or adjust both the "up" current sources 232, 234 and the "down" current sources of the charge pump unit to set the effective CP current of the charge pump unit (e.g., to increase or reduce the effective CP current of the charge pump unit). In the embodiment depicted in FIG. 3, positive and negative time differences between the reference clock input signal (fref) 101 and the divided clock input signal (clk_div) 107 can be measured in the phase tracking state.

The two-flop synchronizer 362 of the synchronization unit 322 includes two serially connected flip-flops 368, 370, two multiplexers 372, 374, and an OR gate 376. In the embodiment depicted in FIG. 3, the flip-flops 368, 370 are configured to be enabled by the divided clock input signal (clk_div) 107 and to sample the reference clock input signal (fret) 101 to generate the sampled reference clock signal (clk_ref_sample) 108. The multiplexers 372, 374 are connected to the first and second flip-flops 368, 370 and are configured to select one of two inputs as an output in response to a synchronization control signal (ctl_en_pfd_mode) 381 that is received by the synchronization control circuit 366. A one-flop synchronizer tends to have metastability issues. For example, a one-flop synchronizer may enter metastability during a phase tracking stage as the reference clock input signal (fret) 101 can change simultaneously with a sampling edge of the divided clock input signal (clk_div) 107. Compared to a one-flop synchronizer that tends to have metastability issues, the two-flop synchronizer has better resistance against metastability because of an extra divider clock period for synchronization. In some embodiments, during the phase locking stage, the phase offset signal 102 is increased to accommodate the extra divider clock period used for synchronization. Under the phase locking state, only the signal (cp_up) 244 that is used to drive the "up" current sources 232, 234 of the charge pump unit 224 is generated (i.e., the signal 242 being zero).

The phase frequency detector (PFD) 364 of the synchronization unit 322 includes two flip-flops 378, 380, a multiplexer 382, and an AND gate 384. The flip-flop 378 is configured to be enabled by the reference clock input signal (fret) 101 to generate the cp_up signal 244 for the charge pump unit 224. The flip-flop 380 is configured to be enabled in response to the synchronization control signal (ctl_en_pfd_mode) 381 to generate the cp_down signal 242 for the charge pump unit. The multiplexer 382 is configured to generate a reset signal 379 for the flip-flops 378, 380 in response to the cp_up signal 242 and the cp_down signal 244. A signal edge (e.g., a rising edge) of the sampled reference clock signal (clk_ref_sample) 108 in turn resets the flip-flop 378. The effective CP current, en_cp, is a combination of the cp_up signal 244 and the cp_down signal 242. In some embodiments, the effective CP current, en_cp, can be expressed as en_cp=cp_up XOR cp_down. The AND gate 384 is configured to generate an input for the multiplexer based on the cp_up signal 244 and the cp_down signal 242.

The synchronization control circuit 366 of the synchronization unit 322 includes five flip-flops 386, 388, 390, 392, 394, two AND gates 396, 398, and a comparator logic 399. The flip-flops 386, 388 synchronize the reset removal of the asynchronous reset signal, rst_async, on the falling edge of the divided clock input signal (clk_div) 107. The flip-flops 390, 392 synchronize the ctl_en_pfd_mode signal change to the falling edge of the clk_ref_sample signal (clk_ref_sample transition is aligned with the rising edge of clk_div clock). The flip-flop 394 is configured to be enabled by falling edge of the divided clock input signal (clk_div) 107 and to be reset by the output of the flip-flop 388. The AND gate 396 is configured to perform an AND operation on the synchronization control signal (ctl_en_pfd_mode) 381 and the comparator logic 399 output. The comparator logic 399 output is the comparison result between an internal counter, div_counter, 385 and a count target, clk_div_gate_code, 387. The AND gate 398 is configured to perform an AND operation on the divided clock input signal (clk_div) 107 and the output of the flip-flop 394.

In an example of the operation of the synchronization control circuit 366, during the phase locking state, the divided clock input signal (clk_div) 107 is gated with the synchronization control signal (ctl_en_pfd_mode) 381, which is active on a falling edge of the divided clock input signal (clk_div) 107, to generate a PFD input signal (clk_div_pfd) 389 for the phase frequency detector (PFD) 364. During the phase tracking state, both the signal (cp_up) 244 and the signal (cp_down) 242 are generated. The effective CP current is proportional to en_cp=cp_up XOR cp_down. During the phase locking state, the synchronization control signal (ctl_en_pfd_mode) 381 also affects the generation of the sampled reference clock signal (clk_ref_sample) 108. During the switching between the locking and tracking state, the count target (clk_div_gate_code) 387 for an internal counter (div_counter) 385 is temporarily reduced by one and restored to its previous value in a following cycle. During the phase tracking state, the phase offset signal 102 can be adjusted to accommodate only a divider sigma-delta modulator range. Consequently, the CP signal has a minimal length (no time for synchronization is needed). The minimal length of the CP reduces the integrated CP noise, and the in-band noise floor of the ADPLL 180 is improved.

Figure 4:
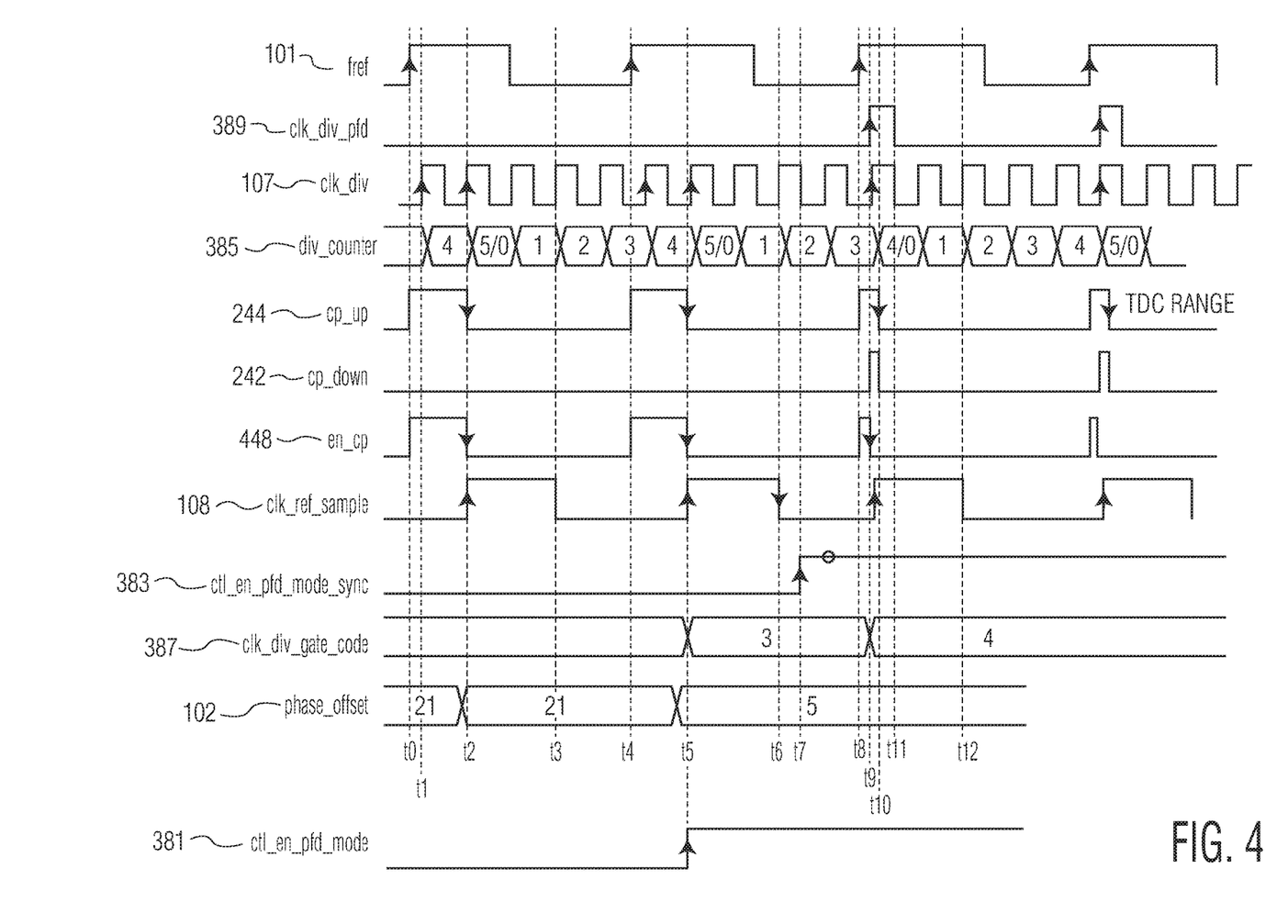
FIG. 4 illustrates a signal timing diagram that corresponds to the synchronization unit depicted in FIG. 3.

FIG. 4 illustrates a signal timing diagram that corresponds to the synchronization unit 322 depicted in FIG. 3. In the signal timing diagram illustrated in FIG. 4, the reference clock input signal (fief) 101, the PFD input signal (clk_div_pfd) 389, the divided clock input signal (clk_div) 107, the internal counter, div_counter, 385, the signal (cp_up) 244, the effective CP current (en_cp) 448, the signal (cp_down) 242, the sampled reference clock signal (clk_ref_sample) 108, the processed synchronization control signal (ctl_en_pfd_mode_sync) 383, the count target (clk_div_gate_code) 387, and the phase offset signal 102 are shown during a phase locking state (before time point t7) and a phase tracking state (after time point t7). For a given frequency channel, the fixed number of divider periods fits into one reference clock period of reference clock input signal (fref) 101. For example, in the signal timing diagram illustrated in FIG. 4, each clock period of the reference clock input signal (fret) 101 is equivalent to five clock periods of the divided clock input signal (clk_div) 107. However, in other embodiments, each clock period of the reference clock input signal (fret) 101 is equivalent to more than five or less than five clock periods of the divided clock input signal (clk_div) 107. The switching between the locking and the tracking state is controlled by ctl_en_pfd_mode signal. The ctl_en_pfd_mode is asserted on the rising edge of the clk_ref_sample clock.

In the signal timing diagram illustrated in FIG. 4, during the phase locking state (before time point t7), the divided clock input signal (clk_div) 107 is used for the synchronization of the reference clock input signal (fref) 101. During the phase tracking state (after time point t7), the performance of the synchronization between the reference clock input signal (fref) 101 and the divided clock input signal (clk_div) 107 is replaced by PFD operation under the control of the synchronization control circuit 366.

At time point t0, the reference clock input signal (fref) 101 changes from 0 to 1, causing the flip-flop 378 to change its output from 0 to 1 at the rising edge of the reference clock input signal (fref) 101. Consequently, the signal (cp_up) 244 and the effective CP current (en_cp) 448 changes from 0 to 1 at time point t0. At time point t0, the processed synchronization control signal (ctl_en_pfd_mode_sync) 383 is at logic 0. Consequently, the multiplexer 372 of the two-flop synchronizer 362 selects its input at input terminal "0," which is the signal (cp_up) 244, as its output.

At time point t1, the divided clock input signal (clk_div) 107 changes from 0 to 1, and the flip-flop 368 sets its output as the same value as its input (i.e., setting its output to 1) at the rising edge of the divided clock input signal (clk_div) 107.

At time point t2, the divided clock input signal (clk_div) 107 changes from 0 to 1 again, and the flip-flop 370 sets its output as the same value as its input (i.e., setting its output to 1) at the rising edge of the divided clock input signal (clk_div) 107. At time point t2, the processed synchronization control signal (ctl_en_pfd_mode_sync) 383 is at logic 0. Consequently, the multiplexer 374 of the two-flop synchronizer 362 selects its input at input terminal "0," which is the output of the flip-flop 370 as its output, and the sampled reference clock signal (clk_ref_sample) 108 changes from 0 to 1. In addition, the multiplexer 382 of the phase frequency detector (PFD) 364 selects the input at input terminal "0," which is the output of the flip-flop 370 as its output, and the flip-flops 378, 380 of the PFD are reset. Consequently, the signal (cp_up) 244 and the effective CP current (en_cp) 448 changes from 1 to 0 at time point t2. After two consecutive rising edges of the divided clock input signal (clk_div) 107, the sampled reference clock signal (clk_ref_sample) 108 changes from 1 to 0 at time point t3.

At time point t4, the reference clock input signal (fref) 101 changes from 0 to 1 again, the processed synchronization control signal (ctl_en_pfd_mode_sync) 383 is still at logic 0, and consequently, the multiplexer 372 of the two-flop synchronizer 362 selects its input at input terminal "0," which is the signal (cp_up) 244, as its output.

At time point t5, the divided clock input signal (clk_div) 107 changes from 0 to 1 for the second time after time point t4, and the flip-flop 370 sets its output as the same value as its input (i.e., setting its output to 1) at the rising edge of the divided clock input signal (clk_div) 107. At time point t5, the processed synchronization control signal (ctl_en_pfd_mode_sync) 383 is still at logic 0, and consequently, the multiplexer 374 of the two-flop synchronizer 362 selects its input at input terminal "0," which is the output of the flip-flop 370 as its output, and the sampled reference clock signal (clk_ref_sample) 108 changes from 0 to 1. In addition, the multiplexer 382 of the phase frequency detector (PFD) 364 selects the input at input terminal "0," which is the output of the flip-flop 370 as its output, and the flip-flops 378, 380 of the PFD are reset. Consequently, the signal (cp_up) 244 and the effective CP current (en_cp) 448 changes from 1 to 0 at time point t5. After two consecutive rising edges of the divided clock input signal (clk_div) 107, the sampled reference clock signal (clk_ref_sample) 108 changes from 1 to 0 at time point t6.

At the time point t5, the clt_en_pfd_mode signal is asserted. The synchronization mode change is delayed until time point t7. At time point t7, the phase locking state ends and the phase tracking state starts and the processed synchronization control signal (ctl_en_pfd_mode_sync) 383 changes from 0 to 1.

At time point t8, the reference clock input signal (fref) 101 changes from 0 to 1, causing the flip-flop 378 to change its output from 0 to 1 at the rising edge of the reference clock input signal (fref) 101, and consequently, the signal (cp_up) 244 and the effective CP current (en_cp) 448 change from 0 to 1. At time point t8, the processed synchronization control signal (ctl_en_pfd_mode_sync) 383 is at logic 1, and consequently, the multiplexer 372 of the two-flop synchronizer 362 selects its input at input terminal "1," which is the signal (ctl_en_clk_div_pfd) 391 from the flip-flop 394, as its output.

At time point t9, the divided clock input signal (clk_div) 107 changes from 0 to 1, and the flip-flop 368 sets its output as the same value as its input (i.e., setting its output to 1) at the rising edge of the divided clock input signal (clk_div) 107. At time point t9, the processed synchronization control signal (ctl_en_pfd_mode_sync) 383 is at logic 1, and consequently, the multiplexer 374 of the two-flop synchronizer 362 selects its input at input terminal "1," which is the output of the OR gate 376, as its output, and the sampled reference clock signal (clk_ref_sample) 108 changes from 0 to 1. In addition, at time point t9, the PFD input signal (clk_div_pfd) 389 changes from 0 to 1, causing the flip-flop 380 to change its output from 0 to 1 at the rising edge of the PFD input signal (clk_div_pfd) 389, and consequently, the signal (cp_down) 242 changes from 0 to 1, and the effective CP current (en_cp) 448 changes from 1 to 0.

At time point t10, the multiplexer 382 of the PFD 364 selects the input at input terminal "1," which is the output of the AND gate 384, as its output, and the flip-flops 378, 380 of the PFD are both reset. Consequently, both the signal (cp_up) 244 and the signal (cp_down) 242 change from 1 to 0 at time point t10.

At time point t9, the div_counter signal 385 is different from the clk_div_gate_code signal 387 and the ctl_en_clk_div_pfd signal 391 changes from 1 to 0 on the next falling edge of the divided clock input signal (clk_div) 107 (time point t11), and consequently, the PFD input signal (clk_div_pfd) 389 changes from 1 to 0. After two consecutive rising edges of the divided clock input signal (clk_div) 107, the sampled reference clock signal (clk_ref_sample) 108 changes from 1 to 0 at time point t12.

Figure 5:
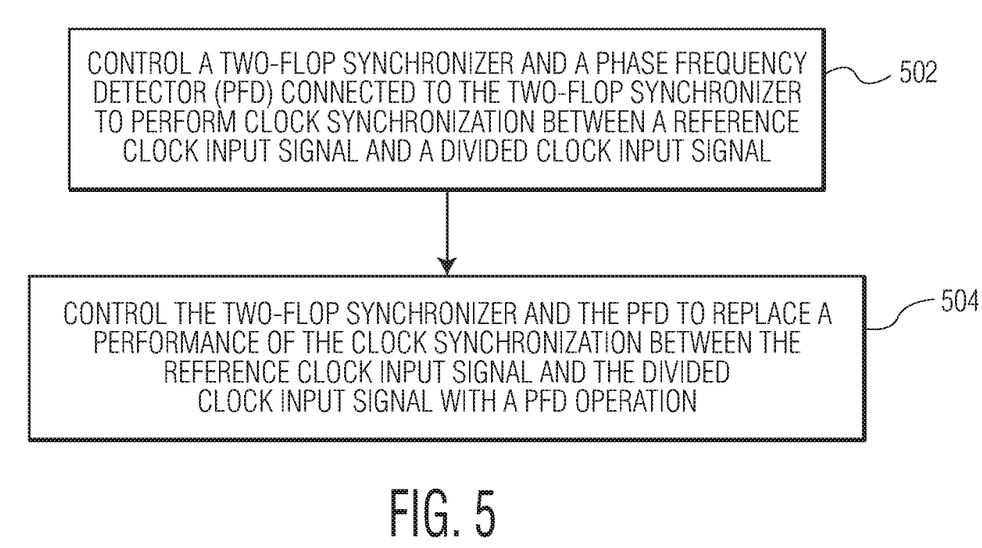
FIG. 5 is a process flow diagram that illustrates a method for clock synchronization in a frequency divider based ADPLL in accordance with an embodiment of the invention.

FIG. 5 is a process flow diagram that illustrates a method for clock synchronization in a frequency divider based All Digital Phase-Locked Loop (ADPLL) in accordance with an embodiment of the invention. The frequency divider based ADPLL may be the same as or similar to the ADPLL with reference to FIGS. 1-3. At block 502, a two-flop synchronizer and a phase frequency detector (PFD) connected to the two-flop synchronizer are controlled to perform clock synchronization between a reference clock input signal and a divided clock input signal. At block 504, the two-flop synchronizer and the PFD are controlled (e.g., by the synchronization control circuit 366) to replace a performance of the clock synchronization between the reference clock input signal and the divided clock input signal with a PFD operation.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A clock synchronization unit for an All Digital Phase-Locked Loop (ADPLL), the clock synchronization unit comprising:
    a two-flop synchronizer;
    a phase frequency detector (PFD) connected to the two-flop synchronizer; and
    a synchronization control circuit configured to control the two-flop synchronizer and the PFD to perform clock synchronization between a reference clock input signal and a divided clock input signal and to control the two-flop synchronizer and the PFD to replace a performance of the clock synchronization between the reference clock input signal and the divided clock input signal with a PFD operation.

2. The clock synchronization unit of claim 1, wherein the PFD operation comprises generating a plurality of charge pump control signals at the PFD for a charge pump unit of the ADPLL.

3. The clock synchronization unit of claim 1, wherein the synchronization control circuit is further configured to generate a synchronization control signal in response to the divided clock input signal, wherein the two-flop synchronizer comprises serially connected first and second flip-flops configured to be enabled by the divided clock input signal, and wherein the two-flop synchronizer further comprises first and second multiplexers connected to the first and second flip-flops and configured to select one of a plurality of inputs as an output in response to the synchronization control signal.

4. The clock synchronization unit of claim 1, wherein the synchronization control circuit is further configured to generate a PFD control signal in response to the divided clock input signal, and wherein the PFD comprises:
    a first flip-flop configured to be enabled by the reference clock input signal to generate a first charge pump control signal;
    a second flip-flop configured to be enabled in response to the PFD control signal to generate a second charge pump control signal; and
    a multiplexer configured to generate a reset signal for the first and second flip-flops in response to the first and second charge pump control signals.

5. The clock synchronization unit of claim 4, wherein the PFD further comprises an AND gate configured to generate an input for the multiplexer based on the first and second charge pump control signals.

6. The clock synchronization unit of claim 1, wherein the clock synchronization unit is a component of a successive approximation register (SAR) Time-to-Digital Converter (TDC) of the ADPLL, wherein the synchronization control circuit is further configured to generate a PFD control signal in response to the divided clock input signal, and wherein the PFD comprises:
    a first flip-flop configured to be enabled by the reference clock input signal to generate a first charge pump control signal for a charge pump unit of the SAR TDC;
    a second flip-flop configured to be enabled in response to the PFD control signal to generate a second charge pump control signal for the charge pump unit of the SAR TDC;
    a multiplexer configured to generate a reset signal for the first and second flip-flops in response to the first and second charge pump control signals; and
    an AND gate configured to generate an input for the multiplexer based on the first and second charge pump control signals.

7. The clock synchronization unit of claim 1, wherein the synchronization control circuit comprises a plurality of flip-flops connected to the PFD or to the two-flop synchronizer.

8. The clock synchronization unit of claim 7, wherein the flip-flops comprise:
    serially connected first and second flip-flops configured to be enabled by an inverted version of the divided clock input signal;
    serially connected third and fourth flip-flops configured to be reset by an output of the first and second flip-flops; and
    a fifth flip-flop configured to be enabled by an inverted version of the divided clock input signal and to be reset by the output of the first and second flip-flops.

9. The clock synchronization unit of claim 8, wherein the synchronization control circuit further comprises:
    a first AND gate configured to perform an AND operation on a synchronization control signal and a counter value; and
    a second AND gate configured to perform an AND operation on the divided clock input signal and an output of the fifth flip-flop.

10. A successive approximation register (SAR) Time-to-Digital Converter (TDC) for an All Digital Phase-Locked Loop (ADPLL), the SAR TDC comprising:
    a clock synchronization unit comprising:
        a two-flop synchronizer;
        a phase frequency detector (PFD) connected to the two-flop synchronizer; and
        a synchronization control circuit configured to control the two-flop synchronizer and the PFD to perform clock synchronization between a reference clock input signal and a divided clock input signal and to control the two-flop synchronizer and the PFD to replace a performance of the clock synchronization between the reference clock input signal and the divided clock input signal with a PFD operation;
    a charge pump unit connected to the clock synchronization unit and configured to generate a current pulse based on a time difference between the reference clock input signal and the divided clock input signal;
    an integrator unit connected to the charge pump unit and configured to generate an integrator output voltage based on the current pulse; and
    a successive approximation analog to digital converter (ADC) unit configured to generate a digital signal based on the integrator output voltage by successive approximation.

11. The SAR TDC of claim 10, wherein the PFD operation comprises generating a plurality of charge pump control signals at the PFD for the charge pump unit.

12. The SAR TDC of claim 11, wherein the synchronization control circuit is further configured to generate a synchronization control signal in response to the divided clock input signal, wherein the two-flop synchronizer comprises serially connected first and second flip-flops configured to be enabled by the divided clock input signal, and wherein the two-flop synchronizer further comprises first and second multiplexers connected to the first and second flip-flops and configured to select one of a plurality of inputs as an output in response to the synchronization control signal.

13. The SAR TDC of claim 10, wherein the synchronization control circuit is further configured to generate a PFD control signal in response to the divided clock input signal, wherein the PFD comprises:
a first flip-flop configured to be enabled by the reference clock input signal to generate a first charge pump control signal for the charge pump unit;
a second flip-flop configured to be enabled in response to the PFD control signal to generate a second charge pump control signal for the charge pump unit; and
a multiplexer configured to generate a reset signal for the first and second flip-flops in response to the first and second charge pump control signals.

14. The SAR TDC of claim 13, wherein the PFD further comprises an AND gate configured to generate an input for the multiplexer based on the first and second charge pump control signals.

15. The SAR TDC of claim 10, wherein the synchronization control circuit comprises a plurality of flip-flops connected to the PFD or to the two-flop synchronizer.

16. The SAR TDC of claim 15, wherein the flip-flops comprise:
serially connected first and second flip-flops configured to be enabled by an inverted version of the divided clock input signal;
serially connected third and fourth flip-flops configured to be reset by an output of the first and second flip-flops; and
a fifth flip-flop configured to be enabled by an inverted version of the divided clock input signal and to be reset by the output of the first and second flip-flops.

17. The SAR TDC of claim 16, wherein the synchronization control circuit further comprises:
a first AND gate configured to perform an AND operation on a synchronization control signal and a counter value; and
a second AND gate configured to perform an AND operation on the divided clock input signal and an output of the fifth flip-flop.

18. A method for clock synchronization in an All Digital Phase-Locked Loop (ADPLL), the method comprising:
controlling a two-flop synchronizer and a phase frequency detector (PFD) connected to the two-flop synchronizer to perform clock synchronization between a reference clock input signal and a divided clock input signal; and
controlling the two-flop synchronizer and the PFD to replace a performance of the clock synchronization between the reference clock input signal and the divided clock input signal with a PFD operation.

19. The method of claim 18, wherein controlling the two-flop synchronizer and the PFD to replace the performance of the clock synchronization between the reference clock input signal and the divided clock input signal with the PFD operation the PFD operation comprises controlling the two-flop synchronizer and the PFD to replace the performance of the clock synchronization between the reference clock input signal and the divided clock input signal with generating a plurality of charge pump control signals at the PFD for a charge pump unit of the ADPLL.

20. The method of claim 19, wherein generating the charge pump control signals at the PFD for the charge pump unit of the ADPLL comprises generating the charge pump control signals at the PFD for adjusting a plurality of current sources of the charge pump unit of the ADPLL.

* * * * *